United States Patent
Eshel et al.

(10) Patent No.: US 10,462,397 B1
(45) Date of Patent: Oct. 29, 2019

(54) SAMPLE-AND-HOLD CIRCUIT WITH FEEDBACK AND NOISE INTEGRATION

(71) Applicant: Sony Semiconductor Solutions Corporation, Kanagawa (JP)

(72) Inventors: Noam Eshel, Pardesia (IL); Golan Zeituni, Kfar-Saba (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/058,559

(22) Filed: Aug. 8, 2018

Related U.S. Application Data (60) Provisional application No. 62/672,905, filed on May 17, 2018.

(51) Int. Cl.
*H04N 5/378* (2011.01)
*G11C 27/02* (2006.01)
*H04N 5/357* (2011.01)

(52) U.S. Cl.
CPC ......... *H04N 5/3575* (2013.01); *G11C 27/026* (2013.01); *H04N 5/378* (2013.01)

(58) Field of Classification Search
CPC ..... H04N 5/3575; H04N 5/378; G11C 27/026
See application file for complete search history.

(56) References Cited

U.S. PATENT DOCUMENTS

| | | | | |
|---|---|---|---|---|
| 9,661,249 | B2* | 5/2017 | Nakamura | H04N 5/378 |
| 10,103,193 | B1* | 10/2018 | Manabe | H01L 27/14643 |
| 2008/0030595 | A1* | 2/2008 | Murakami | H04N 5/335 |
| | | | | 348/222.1 |
| 2009/0201051 | A1* | 8/2009 | Ono | G11C 27/026 |
| | | | | 327/96 |
| 2009/0322922 | A1* | 12/2009 | Saito | H04N 3/1568 |
| | | | | 348/308 |
| 2013/0075583 | A1* | 3/2013 | Parks | H01L 27/14806 |
| | | | | 250/208.1 |

* cited by examiner

*Primary Examiner* — Hung H Lam
(74) *Attorney, Agent, or Firm* — Michael Best & Friedrich LLP (57) ABSTRACT

A sample-and-hold circuit comprises a sampling capacitor; an amplifier transistor; and a noise reduction circuit including an integration capacitor and a feedback capacitor, the noise reduction circuit being configured to reduce noise via a four-phase operation including: an auto-zero phase in which the feedback capacitor is discharged, a feedback phase in which a gate voltage of the amplifier transistor is partially compensated through the feedback capacitor, an integration phase in which the integration capacitor is charged, and a feedforward phase in which the gate voltage of the amplifier transistor is fully compensated by a voltage on the integration capacitor through the feedback capacitor.

20 Claims, 12 Drawing Sheets

FIG. 19

SAMPLE-AND-HOLD CIRCUIT WITH FEEDBACK AND NOISE INTEGRATION

BACKGROUND OF THE INVENTION

1. Field of the Invention

This application relates generally to image sensors. More specifically, this application relates to noise reduction in the sample-and-hold circuit of an image sensor.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light and an electrical signal is generated therefrom. The electrical signal is routed through a collection of analog readout circuits, which may comprise signal amplifiers, signal condition circuits, vertical signal lines (VSLs), sample and hold (S/H) circuits, and analog-to-digital converters (ADCs). Among other operations, the signals from the VSLs are sampled and then converted into digital values by ADCs.

In an ideal image sensor, the S/H circuit holds and outputs a voltage that is equal to the input voltage. However, this assumes ideal conditions and ideal circuit components; e.g., where the resistance of any switch is zero when it is closed, the stray capacitance of any switch is zero when it is opened, the input resistance of any differential amplifier is infinite, the output resistance of any differential amplifier is zero, the open loop gain of any differential amplifier is infinite, noise is not present in the circuit, etc. In a practical image sensor, however, these ideal conditions and ideal circuit components are not present, and deviations result in noise in the circuit.

Moreover, in color image sensors, a color filter array may be overlaid on the pixel circuit array. Depending on the particular color filter array configuration, the conversion gain of the pixel circuits may be reduced to a lower level; perhaps as low as 60 µV/e⁻ (microvolts per electron). As a result, it is desirable to reduce the readout noise (such as noise in the S/H circuit) in order to maintain a good signal-to-noise ratio (SNR).

BRIEF SUMMARY OF THE INVENTION

Various aspects of the present disclosure relate to processing pixels of an image sensor with high accuracy and reduced noise.

In one exemplary aspect of the present disclosure, there is provided a sample-and-hold circuit comprising a sampling capacitor; an amplifier transistor; and a noise reduction circuit including an integration capacitor and a feedback capacitor, the noise reduction circuit being configured to reduce noise via a four-phase operation including: an auto-zero phase in which the feedback capacitor is discharged, a feedback phase in which a gate voltage of the amplifier transistor is partially compensated through the feedback capacitor, an integration phase in which the integration capacitor is charged, and a feedforward phase in which the gate voltage of the amplifier transistor is fully compensated by a voltage on the integration capacitor through the feedback capacitor.

In another exemplary aspect of the present disclosure, there is provided a method of reducing a noise in a sample-and-hold circuit including a sampling capacitor, and amplifier transistor, and a noise reduction circuit, the method comprising discharging a feedback capacitor of the noise reduction circuit; partially compensating a gate voltage of the amplifier transistor through the feedback capacitor; charging the integration capacitor; and fully compensating the gate voltage of the amplifier transistor by a voltage on the integration capacitor through the feedback capacitor.

In another exemplary aspect of the present disclosure, there is provided an image sensor comprising a plurality of pixel circuits arranged in an array; a sample-and-hold circuit; and an analog-to-digital converter configured to receive an output from the sample-and-hold circuit, wherein the sample-and-hold circuit includes a sampling capacitor, an amplifier transistor, and a noise reduction circuit having an integration capacitor and a feedback capacitor, the noise reduction circuit being configured to reduce noise via a four-phase operation including: an auto-zero phase in which the feedback capacitor is discharged, a feedback phase in which a gate voltage of the amplifier transistor is partially compensated through the feedback capacitor, an integration phase in which the integration capacitor is charged, and a feedforward phase in which the gate voltage of the amplifier transistor is fully compensated by a voltage on the integration capacitor through the feedback capacitor.

In this manner, various aspects of the present disclosure provide for improvements in at least the technical fields of imaging and image processing.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as circuit configurations, waveform timings, circuit operations, and the like, in order to provide an understanding of one or more aspects of the present invention. It will be readily apparent to one skilled in the art that these specific details are merely exemplary and not intended to limit the scope of this application.

Moreover, while the present disclosure focuses mainly on examples in which the various circuits are used in image sensors, it will be understood that this is merely one example of an implementation. It will further be understood that the disclosed circuits can be used in any device in which there is a need to sample a signal and/or convert an analog signal to a digital signal; for example, an audio signal processing circuit, an industrial measurement and control circuit, a memory array, and so on.

[Image Sensor]

Figure 1:
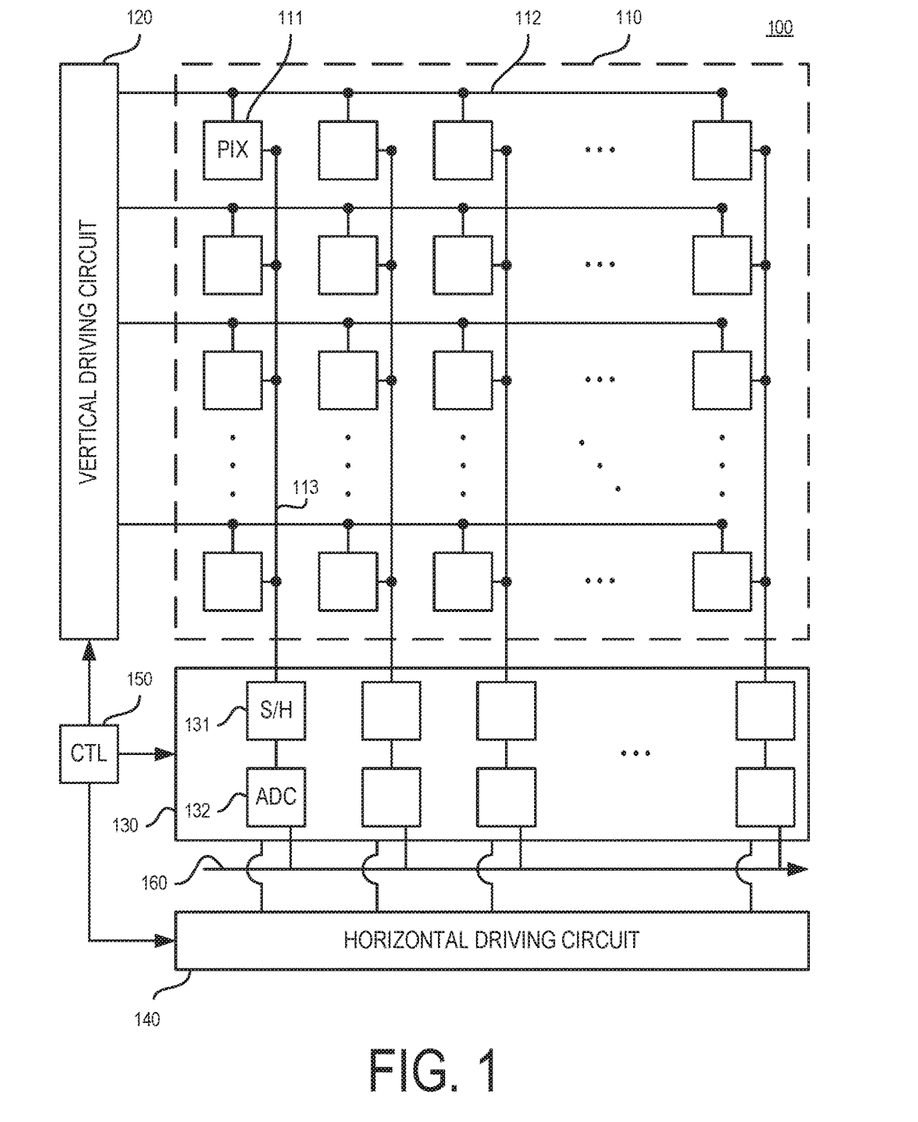
FIG. 1 illustrates an exemplary image sensor according to various aspects of the present disclosure.

FIG. 1 illustrates an image sensor 100. The image sensor 10 includes a rectangular array 110 of M×N pixel circuits 111, where M and N are positive integers. The pixel circuits 111 are located at intersections where horizontal signal lines 112 and VSLs 113 cross one another. The horizontal signal lines 112 are operatively connected to a vertical driving circuit 120, also known as a "row scanning circuit," at a point outside of the pixel array 110, and carry signals from the vertical driving circuit 120 to a particular row of the pixel circuits 111. Pixels in a particular column output an analog signal corresponding to an amount of incident light to the VSL 113. For illustration purposes, only a subset of the pixel circuits 110 are actually shown in FIG. 1; however, in practice the image sensor 100 may have up to tens of millions of pixel circuits ("megapixels" or MP) or more.

The VSL 113 conducts the analog signal for a particular column to a column circuit 130, also known as a "signal processing circuit." A row selection switch may connect the VSL 113 to the column circuit 130. While FIG. 1 illustrates one VSL 113 for each column in the pixel array 110, the present disclosure is not so limited. For example, more than one VSL 113 may be provided for each column, or each VSL 113 may correspond to more than one column. Moreover, while FIG. 1 illustrates a single column circuit 130 for all columns, the image sensor 10 may utilize a plurality of column circuits 130. The analog electrical signal generated in the pixel circuit 111 is retrieved by the column circuit 130 and is then converted to a digital value. Such a conversion typically requires several circuit components such as S/H circuits 131, ADCs 132, and timing and control circuits, with each circuit component serving a purpose in the conversion. For example, the purpose of the S/H circuit 131 may be to sample the analog signals from different time phases of the photodiode operation, after which the analog signals may be converted to digital form by the ADC 132. Furthermore, while FIG. 1 illustrates a single S/H circuit 131 and a single ADC for a column of the pixel circuit 111, other ADC architectures are possible within the context of the present disclosure. These architectures include multiple ADCs for each column, a single ADC for multiple columns, an ADC for a sub-region (e.g. K×L pixel circuits 111 where K and L are positive integers smaller than M and N, respectively), and the like.

The column circuit 130 may be capable of performing the method of correlated double sampling (CDS). CDS is capable of overcoming some pixel noise related issues by sampling each pixel circuit 111 twice. First, the reset voltage $V_{reset}$ of a pixel circuit 111 is sampled. This may also be referred to as the P-phase value or cds value. Subsequently, the data voltage $V_{data}$ of the pixel circuit 111 (that is, the voltage after the pixel circuit 111 has been exposed to light) is sampled. This may also be referred to as the D-phase value or light-exposed value. The reset value $V_{reset}$ is then subtracted from the data value $V_{data}$ to provide a value which reflects the amount of light falling on the pixel circuit 111.

The column circuit 130 is controlled by a horizontal driving circuit 140, also known as a "column scanning circuit." Each of the vertical driving circuit 120, the column circuit 130, and the horizontal driving circuit 140 receive one or more clock signals from a controller 150. The controller 150 controls the timing and operation of various image sensor components such that analog signals from the pixel array 110, having been converted to digital signals in the column circuit 130, are output via an output circuit 160 for signal processing, storage, transmission, and the like.

Figure 2:
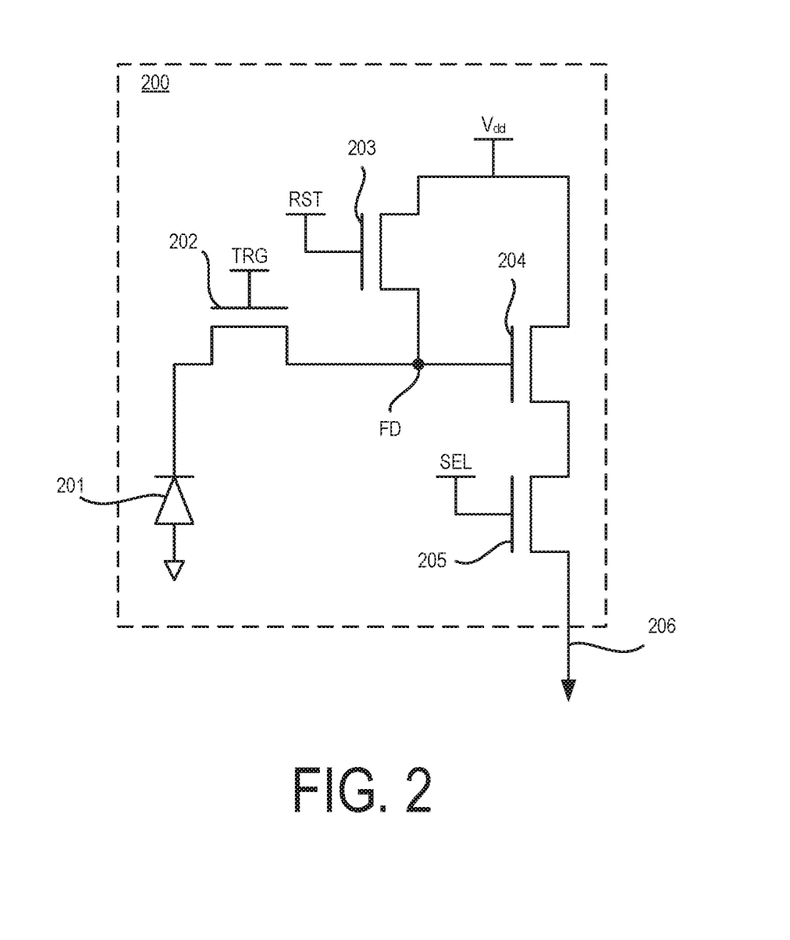
FIG. 2 illustrates an exemplary pixel circuit according to various aspects of the present disclosure.

FIG. 2 illustrates an exemplary pixel circuit 200 according to various aspects of the present disclosure. The pixel circuit 200 may be implemented in an image sensor such as the image sensor 100 described above; that is, the pixel circuit 200 may be the pixel circuit 110. As shown in FIG. 2, the pixel circuit 200 includes a photoelectric conversion device 201 (for example, a photodiode), a floating diffusion FD, a transfer transistor 202, a reset transistor 203, an amplification transistor 204, a selection transistor 205, and a VSL 206. The VSL 206 may be common to a plurality of pixel circuits within the same column. Alternatively, the VSL 206 may be shared among multiple columns. Gate electrodes of the transfer transistor 202, the reset transistor 203, and the selection transistor 205 receive signals TRG, RST, and SEL, respectively. These signals may, for example, be provided by the control or timing circuitry. Light falling on the photoelectric conversion device 201 is converted into an analog electrical signal that is output via the VSL 206.

While FIG. 2 illustrates a pixel circuit 200 having four transistors in a particular configuration, the present disclosure is not so limited and may apply to a pixel circuit having fewer or more transistors as well as other elements, such as capacitors, resistors, and the like. Moreover, while FIG. 1 illustrates the amplification transistor 215 disposed between the selection transistor 216 and a power supply voltage $V_{dd}$, the selection transistor 216 may instead be disposed between the amplification transistor 216 and the power supply voltage $V_{dd}$. Additionally, the present disclosure may be extended to configurations where one or more transistors are shared among multiple photoelectric conversion devices.

Figure 3A:
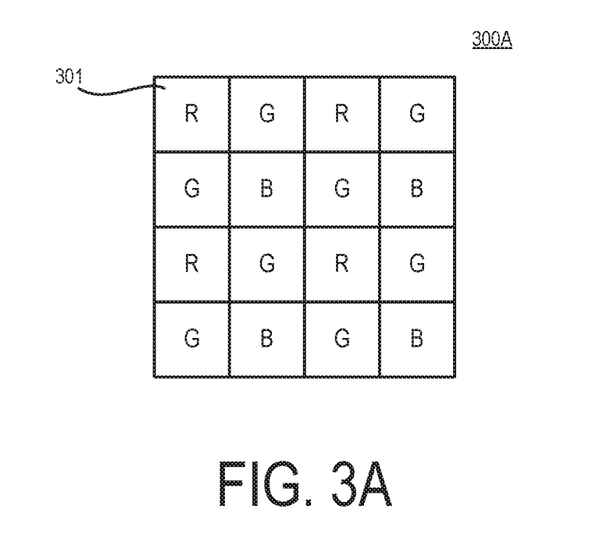
FIGS. 3A and 3B illustrate various exemplary color filter arrays according to various aspects of the present disclosure.
Figure 3B:
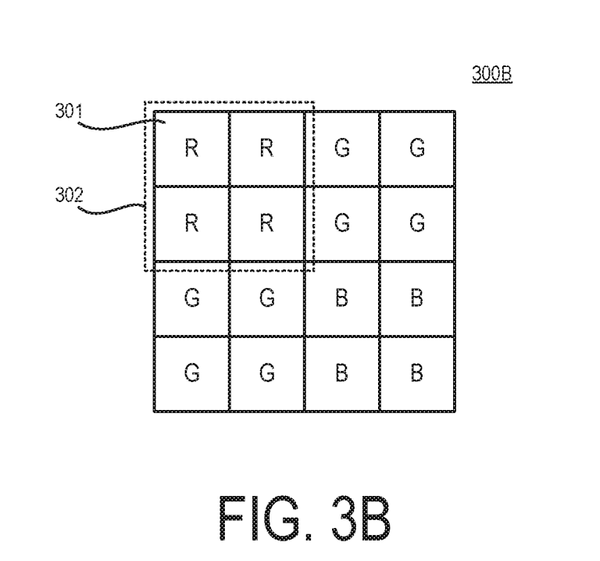

In color image sensors, a color filter array of a primary color (e.g., "R" or red, "G" or green, and "B" or blue) is deposited onto each pixel circuit, with the colors selected so that the different colors are spread out within each local region of the image sensor. FIGS. 3A and 3B illustrate exemplary color filter arrays, where FIG. 3A is a Bayer color filter array 300A and FIG. 3B is a quadra color filter array 300B. As illustrated in FIG. 3A, the Bayer color filter array 300A includes a tiled arrangement of color filters 301, wherein alternating rows include either alternating columns of R and G color filters 301 or alternating columns of G and B color filters 301. As illustrated in FIG. 3B, the quadra color filter array 300B includes a tiled arrangement of color filter blocks 302, each of which includes a 2×2 arrangement of color filters 301 having the same color. In the quadra color filter array 300B, the color filter block 302 can be read out as four different values or as a single combined value. While FIGS. 3A and 3B illustrate only an exemplary 4×4 portion of the array, in practice the color filters 301 are tiled so as to cover the entirety of the underlying pixel circuit array.

[S/H Circuit]

Figure 4:
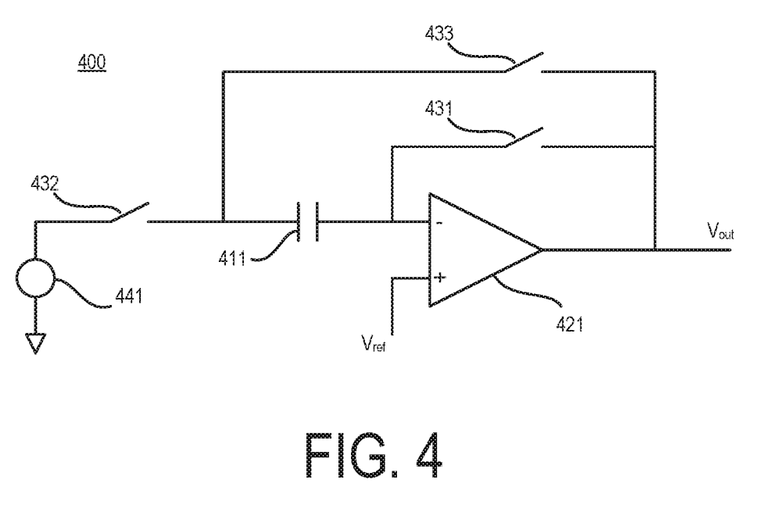
FIG. 4 illustrates an exemplary bottom plate sampling S/H circuit according to various aspects of the present disclosure.

FIG. 4 illustrates an exemplary analog S/H circuit 400 of a bottom plate sampling type. The S/H circuit 400 may be implemented in an image sensor such as the image sensor 100 described above; that is, the S/H circuit 400 may be the S/H circuit 131. The S/H circuit 400 comprises a sampling capacitor 411, an amplifier 421, switches 431, 432, and 433, and an input voltage source 441. $V_{ref}$ is a reference voltage and the voltage source 441 is the input analog voltage (that is, the input signal) to be sampled. The S/H circuit 400 outputs an output voltage $V_{out}$. In an implementation corresponding to the image sensor 100, the voltage source 441 represents the voltage from the pixel circuit 111 via the VSL 113. The switches 431-433 are preferably transistors, such as CMOS transistors.

Figure 5:
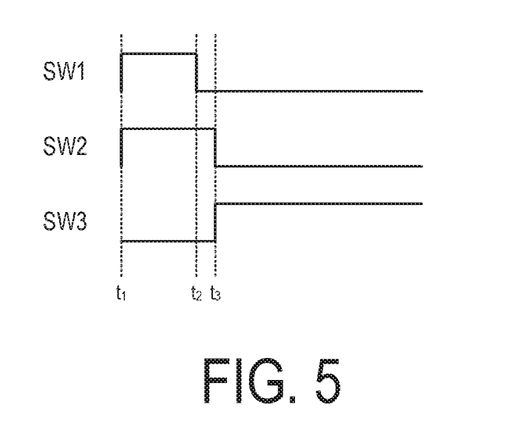
FIG. 5 illustrates an exemplary signal timing diagram of the exemplary S/H circuit according to FIG. 4.

In operation, the switches 431-433 are controlled according to a particular timing. FIG. 5 illustrates an exemplary timing diagram for the operation of the S/H circuit 400 in which the switch 431 is controlled by a control signal SW1, the switch 432 is controlled by a control signal SW2, and the switch 433 is controlled by a control signal SW3. In FIG. 5, for purposes of illustration, "high" signals indicate "closed" switches and "low" signals indicate "open" switches. Thus, FIG. 5 corresponds to the S/H circuit 400 in which the switches 431-433 are implemented as NMOS transistors.

Figure 6A:
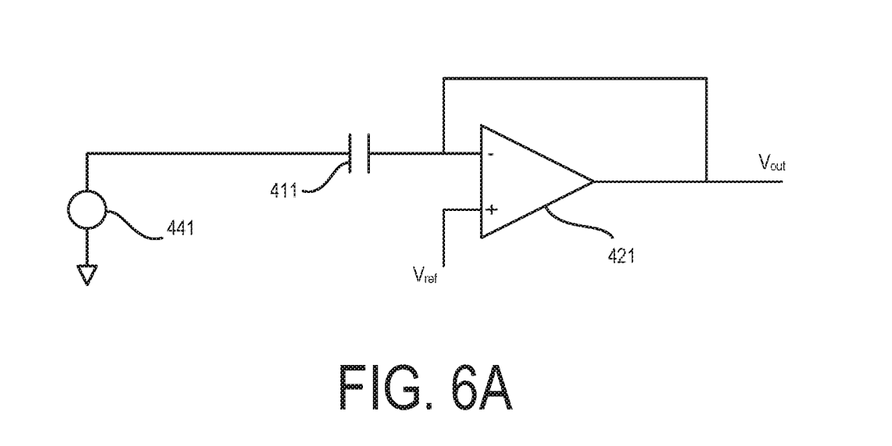
FIGS. 6A, 6B, and 6C illustrate various operating states of the S/H circuit according to FIG. 4.
Figure 6B:
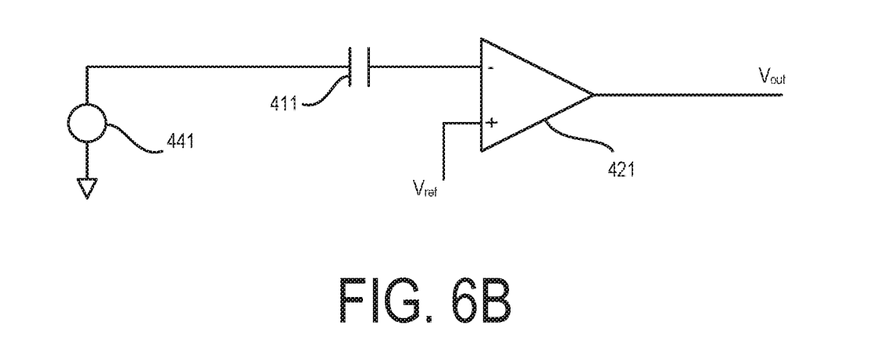
Figure 6C:
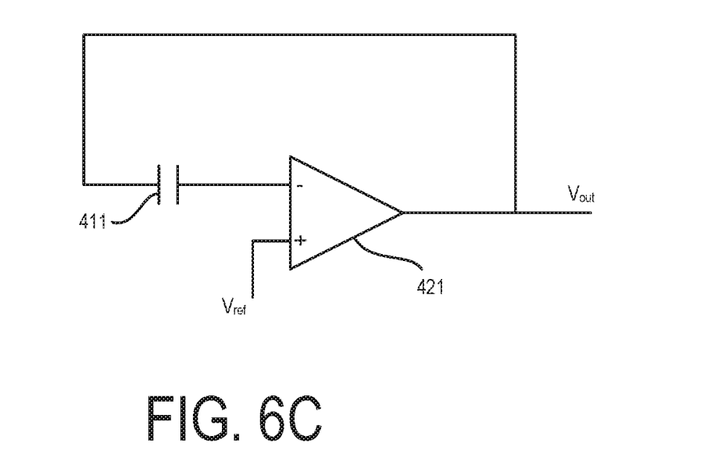

At the beginning of the illustrated period, time $t_1$, the voltage $V_{in}$ from the voltage source 441 is sampled. That is, the switches 431 and 432 are closed, whereas the switch 433 is open. This configuration is illustrated in FIG. 6A. This configuration causes the sampling capacitor 411 to be charged to the voltage $V_{in}-V_{ref}$. After the sampling capacitor 411 has been charged, at time $t_2$, the switch 431 is opened, while the switch 432 remains closed and the switch 433 remains open. This configuration is illustrated in FIG. 6B. This configuration completes the sampling. Then, at time $t_3$, the switches 432 and 433 are reversed. That is, while the switch 431 remains open, the switch 432 becomes open and the switch 433 becomes closed. This configuration is illustrated in FIG. 6C. Assuming the input resistance and gain of the amplifier is infinite, the voltage on the sampling capacitor 411 and the feedback connection on the amplifier 421 causes the sampled signal $V_{in}$ to appear as the output voltage $V_{out}$.

Figure 7:
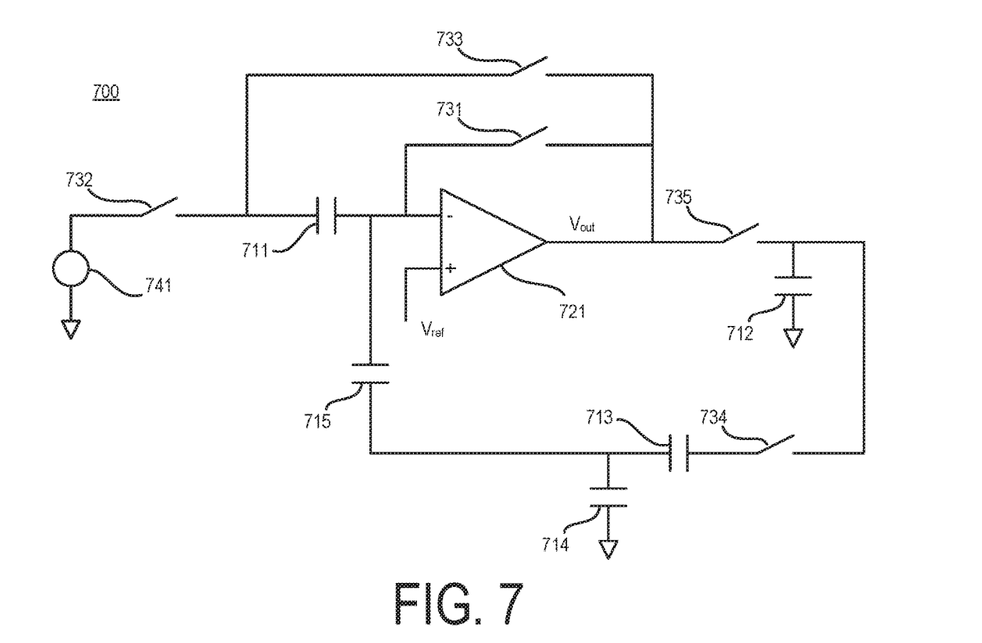
FIG. 7 illustrates an exemplary feedforward S/H circuit according to various aspects of the present disclosure.

FIG. 7 illustrates an exemplary S/H circuit 700 that includes integration and feedforward capabilities in order to compensate for random noise and charge injection noise. The S/H circuit 700 includes a sampling capacitor 711; an output integration capacitor 712; feedback capacitors 713, 714, and 715; a differential amplifier 721; switches 731, 732, 733, 734, and 735; and an input voltage source 741. The switches 734 and 735 and the feedback capacitors 712-715 form an error correction loop. The integrated signal $V_{out}$ is fed via the error correction loop to the negative input terminal of the differential amplifier 721, which results in a reduction of noise.

Figure 8:
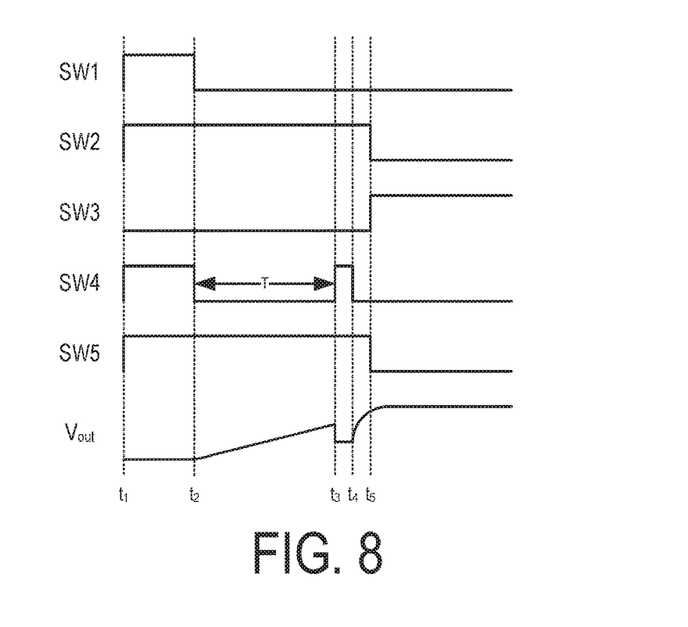
FIG. 8 illustrates an exemplary signal timing diagram of the exemplary S/H circuit according to FIG. 7.

In operation, the switches 731-735 are controlled according to a particular timing. FIG. 8 illustrates an exemplary timing diagram for the operation of the S/H circuit 700, in which the switches 731-735 are controlled by respective control signals SW1-SW5. In FIG. 8, for purposes of illustration, "high" signals indicate "closed" switches and "low" signals indicate "open" switches. Thus, FIG. 8 corresponds to the S/H circuit 700 in which the switches 731-735 are implemented as NMOS transistors. FIG. 8 further illustrates the output voltage $V_{out}$. For purposes of illustration, it is assumed that the input signal $V_{in}$ is constant during a sampling window which begins at time period $t_1$. This input signal is denoted $V_{in}(t_1)$.

At time $t_1$, the switches 731, 732, 734, and 735 are closed, whereas the switch 733 is opened. In the ideal case, the negative input terminal of the differential amplifier 721 is charged to $V_{ref}$ by the feedback loop through the switch 731; this results in the sampling capacitor 711 being charged to the voltage $V_{in}-V_{ref}$. Therefore, the output voltage $V_{out}$ during the time period between time $t_1$ and time $t_2$ is equal to $V_{ref}$. At this stage, charge injection has not yet happened. At time $t_2$, the switches 731 and 734 are opened, the switches 732 and 735 remain closed, and the switch 733 remains opened. The opening of the switch 731 provides a source of charge injection. As a result, the combined effects of charge injection and noise modify the differential voltage at the inputs of the differential amplifier 721. This may be represented as an increase in voltage of the negative input terminal of the differential amplifier 721 by an amount $\Delta V$. The voltage of the sampling capacitor 711 thus becomes $(V_{in}-V_{ref}+\Delta V)$. To correct for $\Delta V$, the error correction loop feeds back to the negative terminal of the differential amplifier 721 an amount of charge calculated so as to cancel out the voltage $\Delta V$. This feedback process begins between time $t_2$ and time $t_3$.

Beginning at time $t_2$, an error current $I_{error}$ is generated due to the non-zero differential voltage of the differential amplifier 721. This error current $I_{error}$ causes the output integration capacitor 712 to charge from its previous value ($V_{ref}$). This process continues for a period of time T as illustrated in FIG. 8. The magnitude of the error current $I_{error}$ is given by the relation $I_{error}=g_m \times \Delta V$, where $g_m$ is the transconductance of the differential amplifier 721. Therefore, the voltage $V_{out}$ at time $t_3$ is given by the relation $V_{out}(t_3)=V_{out}(t_2)+(I_{error} \times T)/C_{int}$, where $C_{int}$ is the capacitance of the output integration capacitor 712.

At time $t_3$, the switch 734 is briefly closed while the switches 731-733 and 735 remain in their previous state. Therefore, the output integration capacitor 712 and the feedback capacitor 713 are connected so that the integration level $V_{out}$ is sampled by the feedback capacitors 713-715. This adds a feedback voltage V to the negative input terminal of the differential amplifier 721 with an amount given by the relation $V_{FB}=\beta \times \Delta V_{int}=-(B \times I_{error} \times T_{int})/C_{int}$, where $\beta$ is a parameter that depends on the respective capacitance values of the capacitors 711 and 713-715. The feedback voltage $V_{FB}$ will be equal to $\Delta V$, thus canceling out the voltage $\Delta V$, if the design parameters are chosen such that $\Delta V=V_{FB}=(\beta \times I_{error} \times T_{int}/C_{int}$, and $I_{error}=g_m \times \Delta V$; thus, $g_m=(C_{int}/T_{int}) \times (1/\beta)$.

At time $t_4$, the switch 734 is reopened while the switches 731-733 and 735 remain in their previous state. This disconnects the error correction loop from the output integrating capacitor 712. At time $t_5$, after a transitional time period, the switches 732 and 735 are opened and the switch 733 is closed. The switches 731 and 734 are unchanged at this time. Assuming the input resistance and gain of the differential amplifier 721 is infinite, the output voltage $V_{out}$ is driven up to a voltage $V_c$ on the sampling capacitor 711 plus the reference voltage $V_{ref}$. Because the error $\Delta V$ was previously canceled out, the voltage of the sampling capacitor 711 at time $t_5$ is given by the relation $V_c=V_{in}(t_1)-V_{ref}$. Thus, the output $V_{out}$ becomes $V_c+V_{ref}$, which is equal to $V_{in}(t_1)$. In other words, during the time period beginning at $t_5$ the output signal $V_{out}$ becomes equal to the sampled voltage $V_{in}(t_1)$ without the error $\Delta V$.

While the above approach may reduce the injection noise, it may be desirable to further reduce the injection noise level. Generally, the noise bandwidth $N_{BW}$ of an S/H circuit is inversely proportional to the integration time $T_{int}$; specifically, $N_{BW}=1/(2\times T_{int})$. One way to reduce the S/H noise would be to increase the integration time so that the noise bandwidth is reduced. However, increasing the integration time causes the signal to increase linearly with the integration time, and may therefore cause a saturation in the integration signal. If the integration signal $V_{out}$ during the integration period T illustrated in FIG. 8 approaches the power supply or ground rails of the differential amplifier 721, the output integration capacitor 712 may no longer behave like an integrator and the circuit may not behave as intended.

Another way to reduce the S/H noise would be to set the operating point of the differential amplifier 721 to have a low transconductance $g_m$, so that the current produced by the charge injection voltage multiplied by the transconductance will not saturate the output voltage at a given integration time. However, when the transconductance of a differential amplifier is decreased the thermal noise power spectral density of the differential amplifier increases. Therefore, even though the noise bandwidth is decreased, the overall noise generated by the amplifier may not necessarily be decreased as desired.

Yet another way to reduce the S/H noise would be to increase the capacitance of the output integration capacitor 712. However, this has the result that the die area for the capacitor will have to be increased or else capacitors from neighboring columns must be used; in either case, circuit complexity will be increased. Accordingly, it is preferable to find a way to reduce the circuit noise in an S/H circuit without increasing integration time or increasing capacitance.

[Circuit Noise Reduction]

To accomplish this, it is possible to divide the noise reduction time of an S/H circuit into two intervals. During the first interval, the charge injection noise is compensated using a negative feedback arrangement so that a significant portion of the noise is reduced. During the second interval, noise integration is performed so that the noise level is further reduced. In practice, noise integration provides a more effective reduction in noise compared to feedback. Thus, the two intervals are apportioned such that the noise integration interval is longer than the feedback interval.

Figure 9:
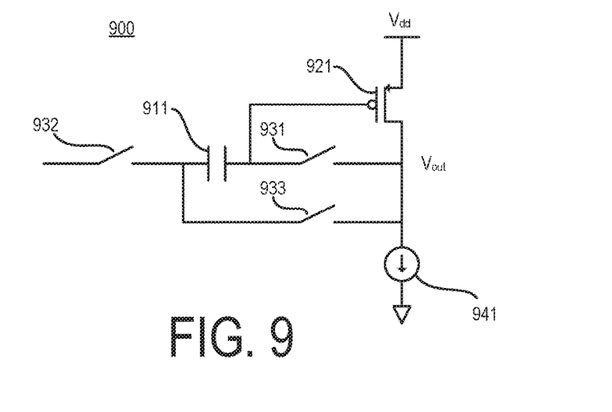
FIG. 9 illustrates an exemplary PMOS S/H circuit according to various aspects of the present disclosure.
Figure 10:
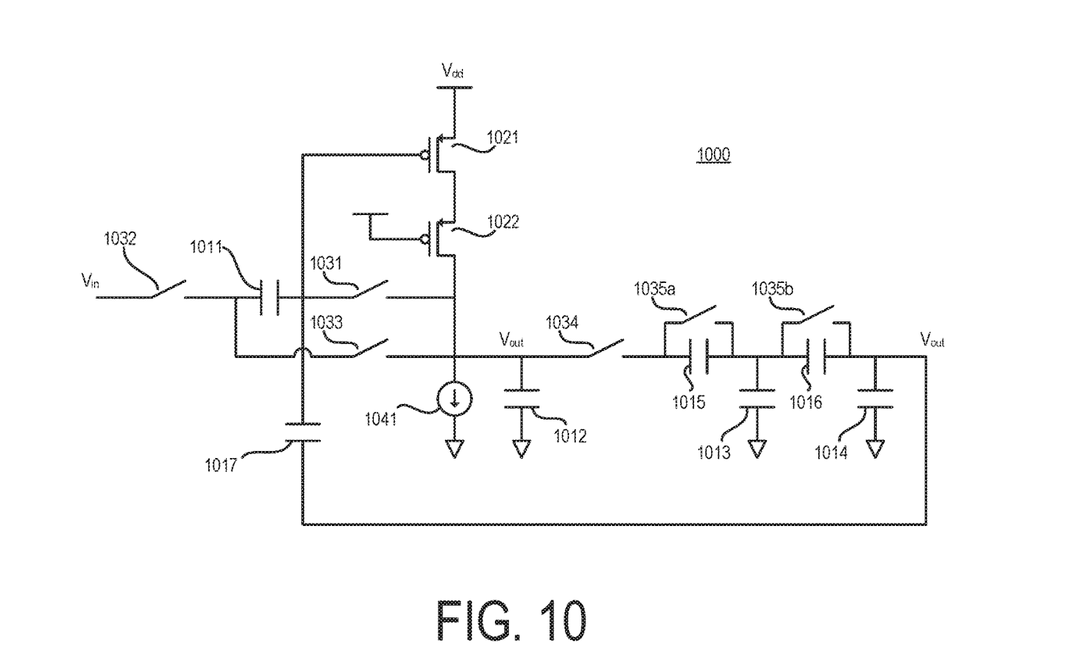
FIG. 10 illustrates another exemplary feedforward S/H circuit according to various aspects of the present disclosure.

One such exemplary way to achieve reduced circuit noise without increased integration time or capacitance is based on an S/H circuit 900 with PMOS transistors as illustrated in FIG. 9. The S/H circuit 900 includes a sampling capacitor 911, a PMOS transistor 921, switches 931-933, and a current source 941. The transistor 921 and the current source 941 are connected between a power supply voltage $V_{dd}$ and ground. The switches 931-933 may be operated on a similar timing as that represented in FIG. 5 above. When the switches 931 and 932 are closed, the voltage stored on the sampling capacitor 911 is $V_{cap}=V_{g(921)}-V_{in}$, where $V_{g(921)}$ is the gate voltage of the transistor 921. When the switches 931 and 932 are opened and the switch 933 is closed, the output voltage $V_0$ of the S/H circuit 900 is $V_{out}=V_{g(921)}-V_{cap}=$ The S/H circuit 900 may be extended to support feedback, integration, and feedforward operations. FIG. 10 illustrates such an S/H circuit 1000. The S/H circuit 1000 may be implemented in an image sensor such as the image sensor 100 described above; that is, the S/H circuit 1000 may be the S/H circuit 131. Similar to the S/H circuit 900, the S/H circuit 1000 includes a sampling capacitor 1011, a PMOS transistor 1021, switches 1031-1033, and a current source 1041. This design is extended by the additional inclusion of another PMOS transistor 1022, additional switches 1034 and 1035a-b, and additional capacitors 1012-1017 of which the capacitor 1012 is an integration capacitor and the capacitor 1017 is a feedback capacitor. In the explanation below, where it is not necessary to distinguish between the switch 1035a and the switch 1035b, they will collectively be referred to as the switch 1035.

By way of an example, the sampling capacitor 1011 may have a capacitance of 320 fF, the integration capacitor 1012 may have a capacitance of 40 fF, the capacitors 1013 and 1014 may each have a capacitance of 20 fF, the capacitors 1015 and 1016 may each have a capacitance of 10 fF, the feedback capacitor 1017 may have a capacitance of 10 fF, and the current source 1041 may provide a constant current of 1.5 µA. While this is one example including a particular set of circuit component configurations and parameter values, the present disclosure is not restricted to these exact arrangements and values.

Figure 11:
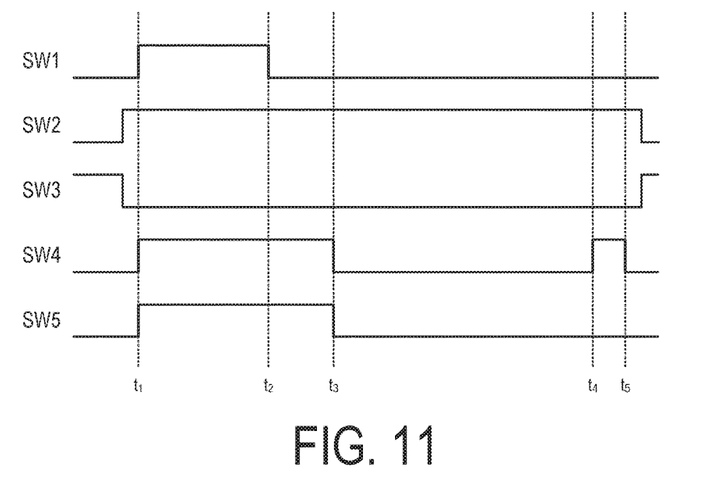
FIG. 11 illustrates an exemplary signal timing diagram of the exemplary S/H circuit according to FIG. 10.

In operation, the switches 1031-1035 are operated according to a particular timing. FIG. 11 illustrates an exemplary timing diagram for the operation of the S/H circuit 1000 in which the switch 1031 is controlled by a control signal SW1, the switch 1032 is controlled by a control signal SW2, the switch 1033 is controlled by a control signal SW3, the switch 1034 is controlled by a control signal SW4, and the switches 1035a and 1035b are controlled by a control signal SW1. As illustrated in FIG. 11, the circuit operation is divided into four timing intervals: an auto-zero phase from time $t_1$ to time $t_2$, a feedback phase from time $t_2$ to time $t_3$, an integration phase from time $t_3$ to time $t_4$, and a feedforward phase from time $t_4$ to time $t_5$. These four timing intervals are followed by a hold phase beginning at time $t_5$. In FIG. 11, for purposes of illustration, "high" signals indicate "closed" switches and "low" signals indicate "open" switches. Of the four phases, the integration phase has the longest duration. For example, the integration phase may have a duration of approximately five times the duration of the feedback phase and approximately two-and-a-half times the duration of the auto-zero phase. Given the exemplary circuit component parameters above, the auto-zero phase may have a duration of 1 µs, the feedback phase may have a duration of 0.5 µs, and the integration phase may have a duration of 2.5 µs. FIGS. 12-16 illustrate the various phases of the S/H circuit 1000 where, for simplicity of presentation, closed switches are shown as a wire and open switches are not shown.

Figure 12:
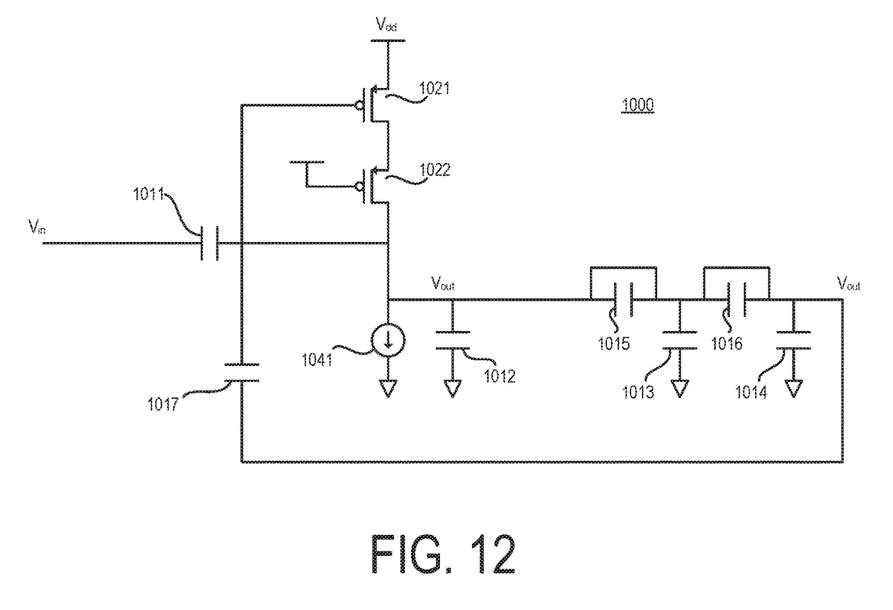
FIGS. 12-16 illustrate various operating states of the correction circuit according to FIG. 10.

The S/H circuit 1000 during the auto-zero phase is illustrated in FIG. 12. At time $t_1$, the beginning of the auto-zero phase, the switches 1031-1032 and 1034-1035 are closed and the switch 1033 is open. Because the switches 1035a-b are closed, the capacitors 1015 and 1016 are discharged. Similarly, because the switch 1031 is closed, the feedback capacitor 1017 is discharged. On the other hand, the capacitors 1013 and 1014 are charged to an auto-zero voltage where the level is dependent on the characteristics of the transistor 1021. The S/H circuit 1000 transitions from the auto-zero phase to the feedback phase at time $t_2$.

Figure 13:
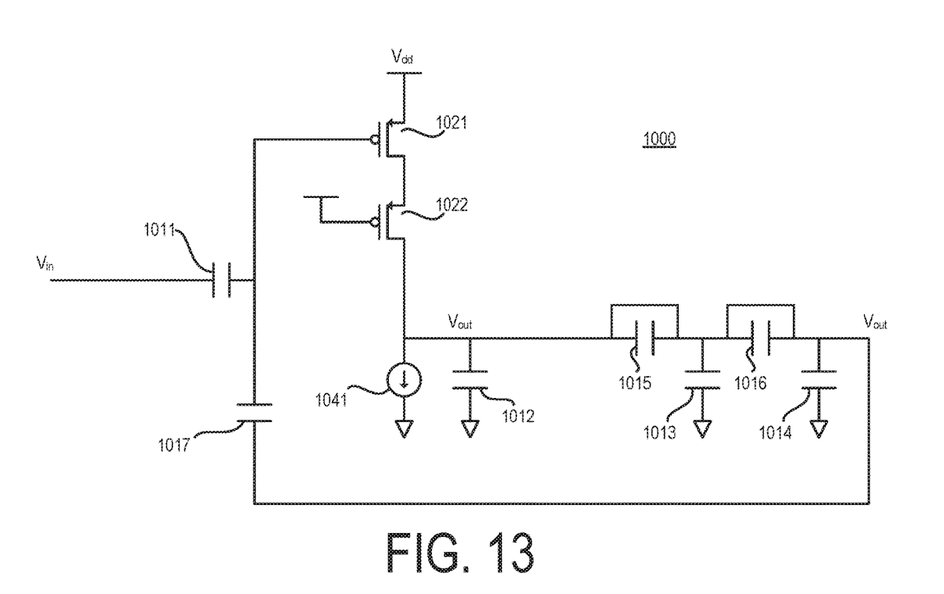

The S/H circuit 1000 during the feedback phase is illustrated in FIG. 13. At time $t_2$, the switch 1031 is opened while the switches 1032 and 1034-1035 remain closed and the switch 1033 remains open. Because the switch 1031 is now open, the transistor 1021 works in a closed loop mode through the feedback capacitor 1017. Charge injection at the gate of the transistor 1021 raises the gate voltage $V_g$ of the transistor 1021. The switch 1031 is a p-type switch and thus has positive charge injection. Given the exemplary parameters of the S/H circuit 1000, the gate voltage $V_g$ may be raised by a few mV. As a result of the rising gate voltage $V_g$, the voltage $V_{out}$ is pulled down. Due to the feedback path, a decrease in $V_{out}$ pulls the gate voltage $V_g$ down via the feedback capacitor 1017. In other words, the change in the gate voltage $V_g$ as a result of the charge injection is being canceled by the feedback action. By keeping the duration of the feedback phase short (e.g., a few hundred ns), most of the effect of the charge injection and the kTC noise at the gate-source voltage $V_{gs}$ of the transistor 1021 is compensated. The S/H circuit 1000 transitions from the feedback phase to the integration phase at time $t_3$.

Figure 14:
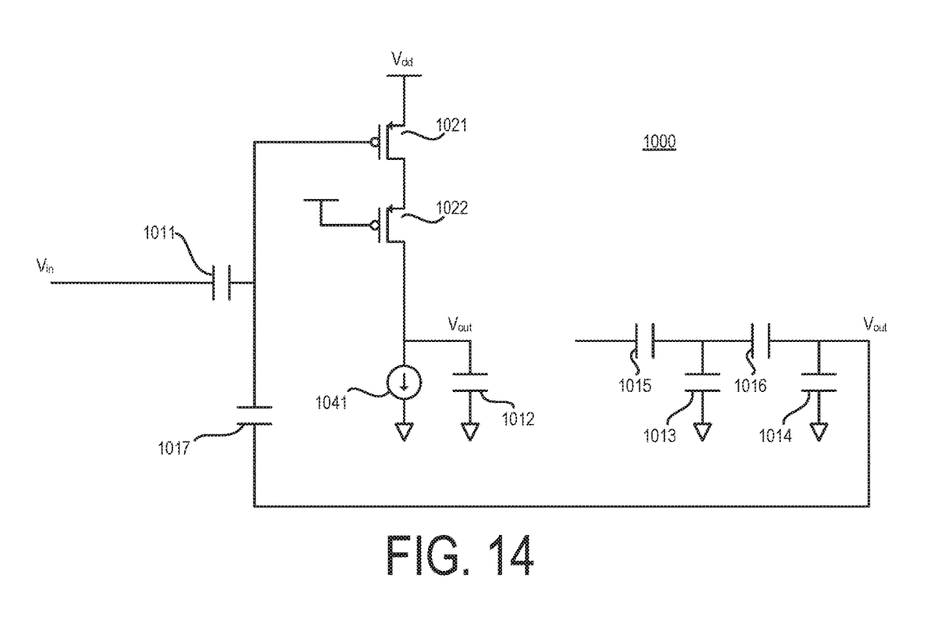

The S/H circuit 1000 during the integration phase is illustrated in FIG. 14. At time $t_3$, the switches 1034-1035 are opened while the switches 1031 and 1033 remain open and the switch 1032 remains closed. This results in the feedback loop comprising the capacitors 1013-1017 being turned off. At this time, the gate voltage $V_g$ of the transistor 1021 has not been fully compensated and still has a higher voltage than an auto-zero voltage. Therefore, $V_{out}$ is linearly pulled down by the difference between the current at the current source 1041 and the drain current at the transistor 1021. As a result, the difference current flows through the integration capacitor 1012. Therefore, the integration capacitor 1012 is charged during the integration phase. The S/H circuit 1000 transitions from the integration phase to the feedforward phase at time $t_4$.

Figure 15:
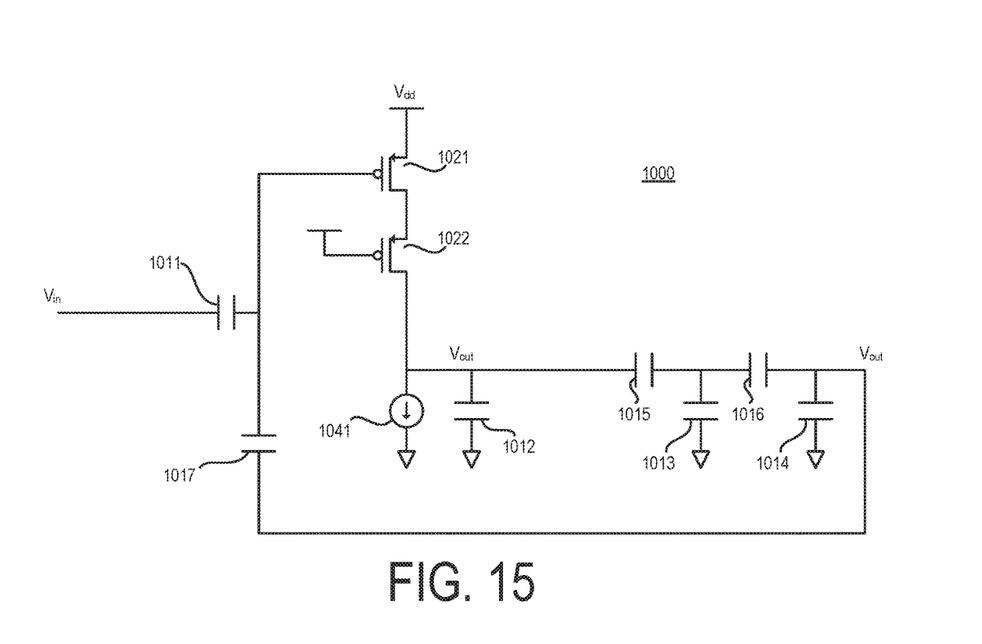

The S/H circuit 1000 during the feedforward phase is illustrated in FIG. 15. At time $t_4$, the switch 1034 is closed while the switches 1031, 1033, and 1035 remain open and the switch 1032 remains closed. The S/H circuit 1000 is thus in a closed loop configuration where the transistors 1021 and 1022 and the associated voltages $V_g$ and $V_{out}$ are acted on in the closed loop via the capacitor 1013-1016, which act as voltage dividers. A fraction of the voltage $V_{out}$ as determined by the capacitors 1013-1016 is fed via the feedback capacitor 1017, which results in a small pull down of the voltage $V_g$. If the circuit values are particularly calibrated, the charge injection noise and the kTC noise in the net gate voltage $V_g$ are fully compensated. At time $t_5$, the switch 1034 is opened so as to end the feedforward phase. After a brief pause as illustrated in FIG. 11, the switch 1032 is opened and the switch 1033 is closed. Thus, the S/H circuit 1000 transitions to the hold phase.

Figure 16:
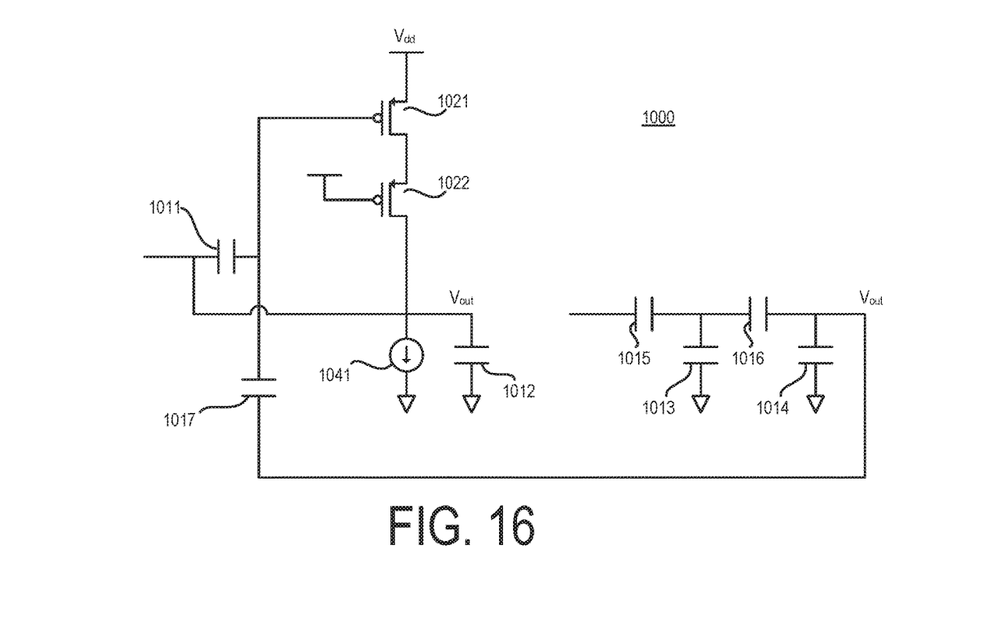

The S/H circuit 1000 during the hold phase is illustrated in FIG. 16. During the hold phase, the switch 1033 is closed, whereas the switches 1031-1032 and 1034-1035 are opened. The S/H circuit 1000 thus enters a steady state where the output voltage $V_{out}$ is held steady and may be used by the downstream circuits. Because the switch 1032 is open, $V_{in}$ is not connected to the input of the S/H circuit 1000 at this time.

Figure 17:
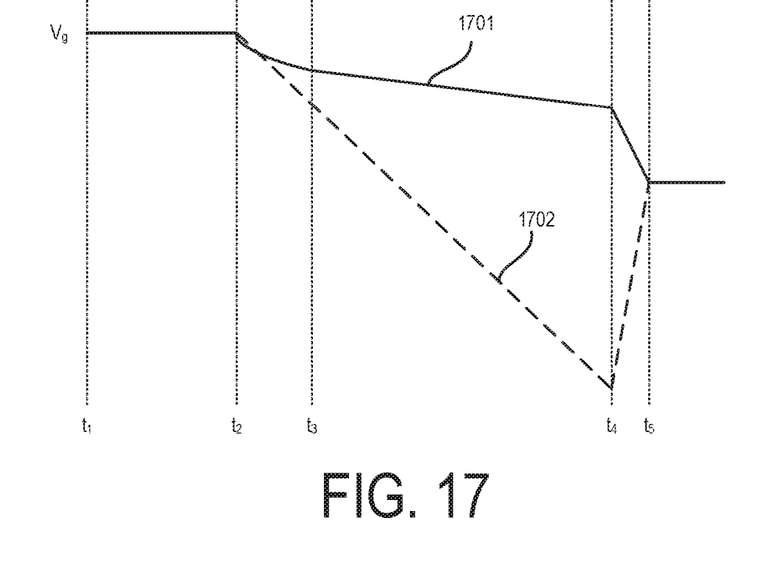
FIG. 17 illustrates an exemplary output voltage diagram according to various aspects of the present disclosure.

FIG. 17 illustrates a comparison between the four-phase operation described above and an "integration-only" approach and, specifically, a comparison of the voltage on the integration capacitor 1012 in each approach. In FIG. 17, the four-phase operation voltage is plotted as solid line 1701 and the integration-only operation voltage is plotted as dashed line 1702. Due to the addition of the feedback phase in the operation illustrated by line 1701, the gate voltage $V_g$ is significantly reduced. As a result, the charge in the integration capacitor 1012 changes at a slower rate during the integration phase (time $t_3$ to time $t_4$) as compared to the integration-only approach. This prevents saturation and thus results in a better compensation of charge injection and kTC noise with a longer possible integration time.

[Calibration]

Figure 18:
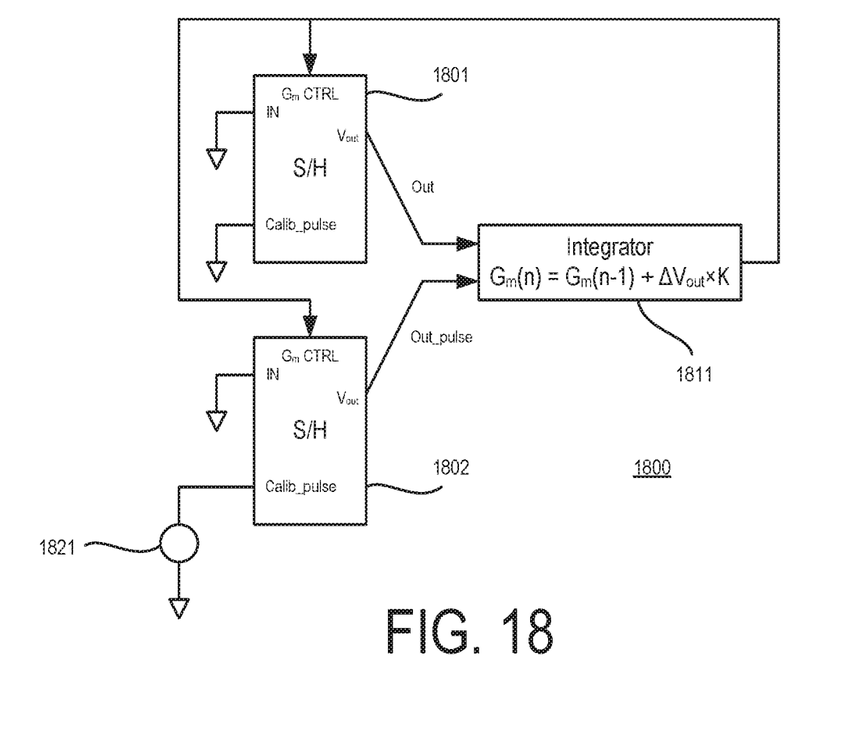
FIG. 18 illustrates an exemplary calibration circuit according to various aspects of the present disclosure.

As noted above, a proper compensation of the charge injection and kTC noise requires a proper calibration of the circuit values. In particular, it is necessary to calibrate for the given integration time and the transconductance $g_m$ of the transistor by adjusting the value of the constant current source. FIG. 18 illustrates an exemplary calibration circuit 1800 which includes a pair of S/H circuits 1801 and 1802, an integrator 1811, and a pulse generator 1821. The S/H circuits 1801 and 1802 are provided with a pulse input capacitor. An example of an S/H circuit with a pulse input capacitor is provided in FIG. 19.

Figure 19:
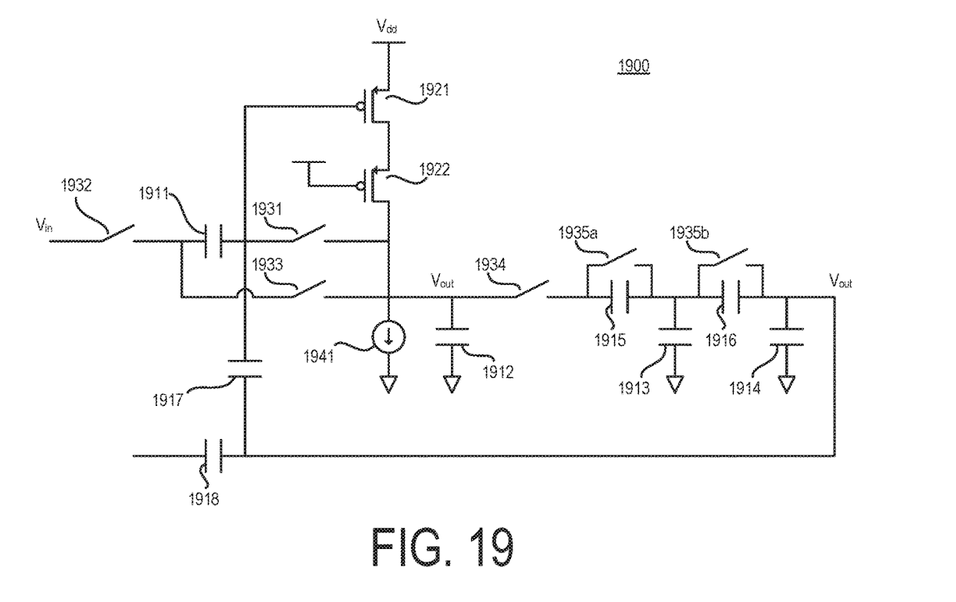
FIG. 19 illustrates another exemplary feedforward S/H circuit according to various aspects of the present disclosure.

Specifically, FIG. 19 illustrates an S/H circuit 1900 which is similar to the S/H circuit 1000 described above in that it includes a sampling capacitor 1911, an integration capacitor 1912, loop capacitors 1913-1916, a feedback capacitor 1917, PMOS transistors 1921 and 1922, switches 1931-1934 and 1935a-b, and a current source 1941. However, the S/H circuit 1900 additionally includes a pulse input capacitor 1918. S/H circuit 1900 may be operated on a similar timing to that illustrated in FIG. 11 so as to allow for the four-phase operation.

By way of an example, the sampling capacitor 1911 may have a capacitance of 320 fF, the integration capacitor 1912 may have a capacitance of 40 fF, the capacitors 1913 and 1914 may each have a capacitance of 20 fF, the capacitors 1915 and 1916 may each have a capacitance of 10 fF, the feedback capacitor 1917 may have a capacitance of 10 fF, and the current source 1941 may provide a baseline constant current of 1.5 µA. While this is one example including a particular set of circuit component configurations and parameter values, the present disclosure is not restricted to these exact arrangements and values.

As illustrated in FIG. 18, the S/H circuit 1802 receives pulses from the pulse generator 1821. These pulses are injected into the feedback path via the pulse input capacitor 1918 illustrated in FIG. 19. Charge injection for the other S/H circuit 1801 is not connected. Output signal Out from the S/H circuit 1801 and output signal Out_pulse from the S/H circuit 1802 are provided to the integrator 1811. The integrator 1811 compares the two output voltages and integrates the error. The integrated result is then used to control the value of $g_m$ for the S/H circuits 1801 and 1801; for example, by changing the bias current of the transistors therein.

When an S/H circuit is tuned or adjusted to the optimal configuration, the charge injected by the correction mechanism fully compensates the injected charge from the pulse generator 1821. In such a condition, the output is free from the effect of error in ΔV. This effect may be utilized to provide calibration by comparing a S/H circuit with an artificial error injected at the time of sampling, such as the S/H circuit 1802, with a similar S/H circuit with no such error injection at the time of sampling, such as the S/H circuit 1801.

As illustrated in FIG. 18, the outputs of the S/H circuits 1801 and 1802 are compared by the integrator 1811. If the two outputs are equal (that is, if $\Delta V_{out}$ is zero), the circuit is tuned and no adjustment is needed. If the two outputs are not equal, then $g_m$ can be increased or decreased in accordance with the difference $\Delta V_{out}$. The integrator 1811 is used to integrate the stream of difference outputs, and the output of the integrator 1811 is fed back to control $g_m$ in the S/H circuits 1801 and 1802. In the integrator 1811, the gain value K is a parameter that controls the speed of convergence.

The integrator 1811 may be implemented either by analog circuits or digital circuits. For example, a switched capacitor analog integrator may be used. Because this is an analog integrator with analog input and output signals, this type of integrator may be directly used in the circuit. The gain K may be implemented by controlling the ratio of capacitors in the integrators. Alternatively, a digital integrator may be used. In this implementation, the entire circuit includes an ADC which converts the difference values into digital form. This is followed by a digital integrator which implements the iterative operation illustrated by the integrator 1811 of FIG. 18. The output of the integrator may be routed to a digital-to-analog converter (DAC) to obtain an analog signal which is then used to control the $g_m$ value of the two S/H circuits.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sample-and-hold circuit, comprising:
a sampling capacitor;
an amplifier transistor; and
a noise reduction circuit including an integration capacitor and a feedback capacitor, the noise reduction circuit being configured to reduce noise via a four-phase operation including:
an auto-zero phase in which the feedback capacitor is discharged,
a feedback phase in which a gate voltage of the amplifier transistor is partially compensated through the feedback capacitor,
an integration phase in which the integration capacitor is charged, and
a feedforward phase in which the gate voltage of the amplifier transistor is fully compensated by a voltage on the integration capacitor through the feedback capacitor.

2. The sample-and-hold circuit according to claim 1, further comprising a calibration circuit configured to adjust a transconductance of the amplifier transistor.

3. The sample-and-hold circuit according to claim 2, wherein the calibration circuit is configured to receive a first input signal from the sample-and-hold circuit, to receive a second input signal from a reference circuit, and integrate an error between the first input signal and the second input signal.

4. The sample-and-hold circuit according to claim 3, wherein the reference circuit is a reference sample-and-hold circuit having a similar configuration to the sample-and-hold circuit and further having a pulse input capacitor.

5. The sample-and-hold circuit according to claim 3, wherein the reference circuit is a reference sample-and-hold circuit to which an artificial error has been injected.

6. The sample-and-hold circuit according to claim 1, wherein the noise reduction circuit further includes a plurality of loop transistors.

7. A method of reducing a noise in a sample-and-hold circuit including a sampling capacitor, and amplifier transistor, and a noise reduction circuit, the method comprising:
discharging a feedback capacitor of the noise reduction circuit;
partially compensating a gate voltage of the amplifier transistor through the feedback capacitor;
charging an integration capacitor; and
fully compensating the gate voltage of the amplifier transistor by a voltage on the integration capacitor through the feedback capacitor.

8. The method according to claim 7, further comprising adjusting a transconductance of the amplifier transistor by a calibration circuit of the sample-and-hold circuit.

9. The method according to claim 8, further comprising:
receiving, by the calibration circuit, a first input signal from the sample-and-hold circuit;
receiving, by the calibration circuit, a second input signal from a reference circuit; and integrating an error between the first input signal and the second input signal.

10. The method according to claim 9, wherein the reference circuit is a reference sample-and-hold circuit having a similar configuration to the sample-and-hold circuit and further having a pulse input capacitor.

11. The method according to claim 9, wherein the reference circuit is a reference sample-and-hold circuit to which an artificial error has been injected.

12. The method according to claim 9, wherein the noise reduction circuit further includes a plurality of loop transistors.

13. An image sensor, comprising:
a plurality of pixel circuits arranged in an array;
a sample-and-hold circuit; and
an analog-to-digital converter configured to receive an output from the sample-and-hold circuit,
wherein the sample-and-hold circuit includes a sampling capacitor, an amplifier transistor, and a noise reduction circuit having an integration capacitor and a feedback capacitor, the noise reduction circuit being configured to reduce noise via a four-phase operation including:
an auto-zero phase in which the feedback capacitor is discharged,
a feedback phase in which a gate voltage of the amplifier transistor is partially compensated through the feedback capacitor,
an integration phase in which the integration capacitor is charged, and
a feedforward phase in which the gate voltage of the amplifier transistor is fully compensated by a voltage on the integration capacitor through the feedback capacitor.

14. The image sensor according to claim 13, wherein the sample-and-hold circuit further includes a calibration circuit configured to adjust a transconductance of the amplifier transistor.

15. The image sensor according to claim 14, wherein the calibration circuit is configured to receive a first input signal from the sample-and-hold circuit, to receive a second input signal from a reference circuit, and integrate an error between the first input signal and the second input signal.

16. The image sensor according to claim 15, wherein the reference circuit is a reference sample-and-hold circuit having a similar configuration to the sample-and-hold circuit and further having a pulse input capacitor.

17. The image sensor according to claim 15, wherein the reference circuit is a reference sample-and-hold circuit to which an artificial error has been injected.

18. The image sensor according to claim 13, wherein the noise reduction circuit further includes a plurality of loop transistors.

19. The image sensor according to claim 13, wherein the sample-and-hold circuit is configured to sample a signal from a respective pixel circuit of the plurality of pixel circuits, the signal corresponding to an amount of received light by the respective pixel circuit.

20. The image sensor according to claim 13, wherein the analog-to-digital converter is configured to receive an analog signal from the sample-and-hold circuit and convert the analog signal to a digital signal.

* * * * *